(12) United States Patent
Sattiraju et al.

(10) Patent No.: US 9,665,673 B2
(45) Date of Patent: May 30, 2017

(54) INPUT CAPACITANCE MODELING FOR CIRCUIT PERFORMANCE

(71) Applicant: Oracle International Corporation, Redwood City, CA (US)

(72) Inventors: Sri Harsha Sattiraju, Fremont, CA (US); Joseph Michael Felchlin, San Jose, CA (US)

(73) Assignee: Oracle International Corporation, Redwood City, CA (US)

( * ) Notice: Subject to any disclaimer, the term of this patent is extended or adjusted under 35 U.S.C. 154(b) by 55 days.

(21) Appl. No.: 14/790,790

(22) Filed: Jul. 2, 2015

(65) Prior Publication Data
US 2017/0004238 A1   Jan. 5, 2017

(51) Int. Cl.
*G06F 17/50* (2006.01)
(52) U.S. Cl.
CPC .................. *G06F 17/5036* (2013.01)
(58) Field of Classification Search
CPC ........................................................ G06F 17/50
USPC ........................................................... 716/51
See application file for complete search history.

(56) References Cited

U.S. PATENT DOCUMENTS

| 2008/0133202 A1* | 6/2008 | Tseng .................. G06F 17/5036 703/14 |
| 2008/0215303 A1* | 9/2008 | Ogawa ................ G06F 17/5036 703/14 |

* cited by examiner

*Primary Examiner* — Thuan Do
(74) *Attorney, Agent, or Firm* — Polsinelli PC

(57) ABSTRACT

Implementations of the present disclosure involve methods and systems for modeling input capacitance for a component of an electronic circuit design to accurately and quickly analyze the performance of the circuit. In particular, the methods and systems may provide for an estimated input capacitance for one or more transistor components of the circuit. To determine the estimated input capacitance of a transistor, a computing system may obtain technical information about the circuit and determine one or more virtual nets that include connections between the adjusted transistor and other transistors (or other components) of the circuit design. This information may be utilized by the computing system to calculate an estimated input capacitance for the adjusted transistor of the circuit design. The calculated input capacitance of the transistor may be added into a simple simulation of the circuit design to obtain one or more operational parameters or circuit performance characteristics.

18 Claims, 5 Drawing Sheets

INPUT CAPACITANCE MODELING FOR CIRCUIT PERFORMANCE

FIELD OF THE DISCLOSURE

Aspects of the present invention relate to computing systems and, more particularly, aspects of the present invention involve capacitance modeling of transistor components of a very-large scale integration (VLSI) microelectronic design.

BACKGROUND

Computers or other executing devices are ubiquitous in today's society. They come in all different varieties and can be found in places such as automobiles, laptops or home personal computers, banks, personal digital assistants, cell phones, as well as many businesses. In addition, as computers become more commonplace and software becomes more complex, there is a need for the computing devices to perform faster and more reliably in smaller and smaller packages.

As the design of computing systems continues to increase in complexity in smaller and smaller packages, the time and resources needed for the circuit design increases. For example, it is common to adjust the overall footprint area of transistor components of high performance microprocessors during simulations of the circuit to fine-tune the circuit performance. Adjusting the transistor area may be performed to increase the speed of the circuit, such as in high performance microprocessor designs. However, adjustments to the components of the circuit typically require a re-layout and re-extraction of the circuit to obtain an accurate determination of the circuit performance. Such layouts and extractions of the circuit may take several days of man hours and computations to perform every time an adjustment to the components of the circuit is made. Alternatively, estimations of the circuit performance may be determined from the circuit design. However, such estimates have proven highly inaccurate and may be either pessimistic or optimistic about the circuit performance. To obtain an accurate view of the circuit performance, layout, extraction, and simulation of the circuit is generally required.

It is with these and other issues in mind that various aspects of the present disclosure were developed.

SUMMARY

One implementation of the present disclosure may take the form of a method for analyzing performance of a microelectronic circuit. The method comprises the operations of receiving an alteration to a dimension of a first component of the microelectronic circuit, the component comprising at least one pin for electrically connecting to a second component of the microelectronic circuit, obtaining technical information of the first component of the microelectronic circuit from a database storing at least one design file of the microelectronic circuit, and associating at least one first pin of the first component of the microelectronic circuit design and the second component with a first virtual net of the design. The method may also include the operations of calculating a first input capacitance from at least one input capacitance model estimate, the first input capacitance associated with the alteration to the dimension of the first component of the microelectronic circuit, simulating the microelectronic circuit while applying the calculated first input capacitance at the first virtual net, the simulation providing at least one circuit performance parameter based at least on the calculated first input capacitance of the first virtual net, and creating an microelectronic circuit comprising at least the first component from the microelectronic circuit design.

Another implementation of the present disclosure may take the form of a microelectronic circuit. The circuit includes a transistor comprising at least one pin and a second component comprising a pin electrically connected to the at least one pin of the transistor. Further, at least one circuit performance parameter of the transistor in the microelectronic circuit is determined through the operations of receiving an alteration to a dimension of the transistor of the microelectronic circuit, obtaining technical information of the transistor of the microelectronic circuit from a database storing at least one design file of the microelectronic circuit, associating the at least one pin of the transistor of the microelectronic circuit and the second component with a first virtual net, and calculating a first input capacitance from at least one input capacitance model estimate, the first input capacitance associated with the alteration to the dimension of the transistor of the microelectronic circuit. Further, the operations to determine the at least one circuit performance parameter of the transistor may further include generating an input file to a computing system, the input file instructing the computing system to apply the calculated first input capacitance at the first virtual net during a simulation of the microelectronic circuit and simulating the microelectronic circuit while utilizing the input file, the simulation providing the at least one circuit performance parameter based at least on the calculated first input capacitance of the first virtual net.

Yet another implementation of the present disclosure may take the form of a system for simulating a microelectronic circuit design. The system includes a database storing at least one design file for the microelectronic circuit design, a computing device in communication with the database, and a computer-readable medium with one or more executable instructions stored thereon. When the processing device executes the one or more instructions, the system performs the operations of receiving an alteration to a dimension of a transistor of the microelectronic circuit design, the transistor comprising at least one pin for electrically connecting to a second component of the microelectronic circuit design, obtaining technical information of the transistor from the database, and associating the at least one pin of the transistor of the microelectronic circuit design and the second component with a first virtual net of the microelectronic circuit design. The system further performs the operations of calculating a first input capacitance from at least one input capacitance model estimate, the first input capacitance associated with the alteration to the dimension of the transistor of the microelectronic circuit design, generating an input file to the computing system, the input file instructing the computing system to apply the calculated first input capacitance at the first virtual net during a simulation of the microelectronic circuit design, and simulating the microelectronic circuit design while utilizing the input file, the simulation providing at least one circuit performance parameter based at least on the calculated first input capacitance of the first virtual net, wherein the microelectronic circuit design is utilized to create an microelectronic circuit from the microelectronic circuit design.

DETAILED DESCRIPTION

Implementations of the present disclosure involve methods and systems for modeling input capacitance for a component of an electronic circuit design to accurate and quickly analyze the performance of the circuit. In particular, the methods and systems may provide for an estimated input capacitance for one or more transistor components of the circuit. To determine the estimated input capacitance of a transistor, a computing system may obtain technical information about the circuit under simulation, including an adjusted width of the transistor. Additionally, the computing system may determine one or more virtual nets that include connections between the adjusted transistor and other transistors (or other components) of the circuit design. This information may be utilized by the computing system to calculate an estimated input capacitance for the adjusted transistor of the circuit design, to as much as less than a 5% error. The calculated input capacitance of the transistor may be added into a simple simulation of the circuit design to obtain one or more operational parameters or circuit performance characteristics. Thus, through the methods and systems described herein, a circuit designer may quickly adjust one or more criteria of components of the circuit (such as a width of a transistor component) and obtain a relatively accurate estimation on the effect the adjustment to the component has on the circuit performance. Generally, obtaining an accurate understanding of the changes to the circuit performance from an adjustment to one of the components of the circuit includes a re-layout and re-extraction of the circuit design, typically taking several days to perform. In contrast, by calculating an accurate input capacitance for the adjusted component and including that calculation in a simple simulation of the circuit, the performance of the circuit may be obtained quickly such that the overall design process and time may be significantly reduced.

Figure 1:
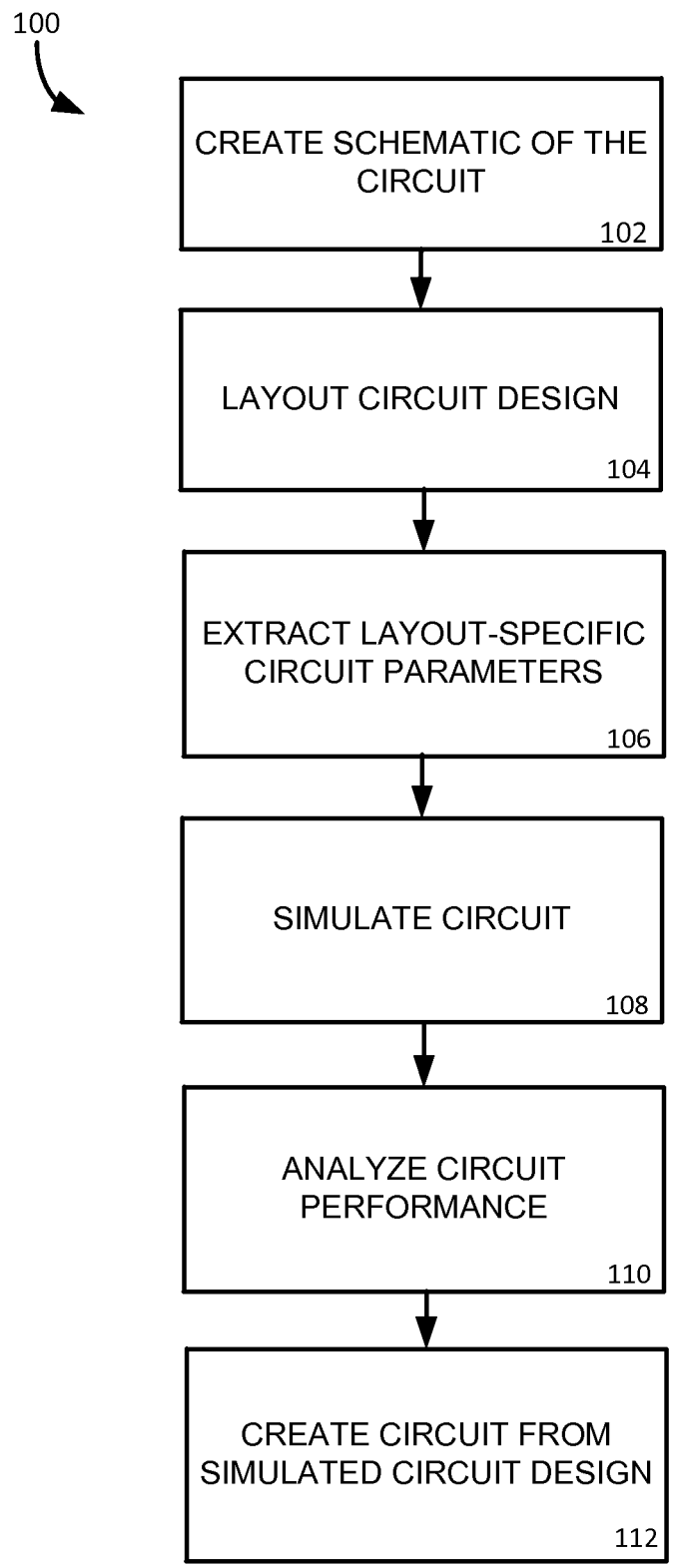
FIG. 1 is a flowchart of a method for analyzing the performance of an electronic circuit design.

FIG. 1 is a flowchart of a method for analyzing the performance of an electronic circuit design. The flowchart illustrates typical steps or operations performed when designing an electronic circuit, such as a microprocessor or other type of microelectronic circuit. The operations may be performed by a designer of the circuit utilizing one or more computing systems, such as laptop computers, desktop computers, mobile computing devices, and the like. Through the analysis of the circuit design performed by the operations of FIG. 1, a circuit designer may determine if the circuit design meets certain circuit performance thresholds and requirements.

Beginning in operation 102, a schematic of the circuit is created that may include the components of the circuit and the interconnections between the components of the circuit. The components of the circuit may include common circuit devices or custom-designed circuit components. For example, a circuit designer may utilize a computing device to create a schematic of a circuit that processes computing data as desired. In operation 104, the computing system may then create a layout of the circuit schematic that includes one or more of the components of the circuit. In general, the circuit design layout provides a visual indication of the components of the circuit, the interconnections between the components of the circuit, and in some cases, a footprint outline of the circuit when fabricated. In other words, the circuit layout is the design of the circuit schematic created by the circuit schematic creator.

In operation 106, the layout-specific circuit parameters are extracted and, in operation 108, the circuit is simulated by the computing system to obtain one or more performance criteria from the circuit. The extraction and simulation allows the computing system to calculate certain types of parasitic effects in the circuit, such as capacitances, resistances, and inductances of the various components and interconnections of the circuit. In one example, an extraction and simulation of the circuit occurs to determine the processing speed of the circuit. Such a simulation may include providing a stimulus to the circuit and observing to obtain an output, while measuring the elapsed time to receive the output of the circuit.

In operation 110, the computing system may analyze the performance of the circuit to determine if the current circuit design meets certain circuit performance thresholds. For example, the circuit performance may be analyzed to ensure that the circuit design performs at a processing speed intended by a circuit designer. Other performance measurements may include power consumed by the circuit and accurate processing of data by the circuit, among other measurements. Through several iterations of the operations of FIG. 1, a computing system or circuit designer may design a microelectronic circuit and modify the circuit to ensure the circuit operates within one or more performance parameters as desired by the circuit designer. Once the performance of the circuit is within the performance parameters, a hardware circuit is created from the simulated circuit design in operation 112. In one implementation, the circuit is a portion of a larger circuit, such as a memory component of a microprocessor circuit. However, the manufactured or created circuit with components may include any number of components and may be any portion of a larger circuit.

Although the operations of FIG. 1 provide for a method for circuit designing, the overall process may take several days for a circuit designer or computing system to complete an iteration of the method. In particular, layout of the circuit design, extraction, and simulation of the circuit may require large amounts of processing power and time, as well as time to redesign the circuit following analysis of the circuit performance. In other words, even relatively small changes to the circuit in response to an analysis of the circuit performance may consume large amounts of computing power and take several days to complete. As such, re-layout and re-extraction of the circuit design is not an efficient method to design very large scale integration (VLSI) microelectronic designs, such as in large scale microprocessors.

In some instances, efforts have been made to reduce the amount of time needed to perform the method of FIG. 1. However, it is often the case that such efforts to reduce the time needed to perform the method result in a less accurate analysis of the circuit performance. For example, some of the parasitic effects on the circuit by the components of the circuit may be estimated to remove at least a portion of the extraction operation of the circuit design. By estimating such effects on the circuit by the components, a less accurate simulation of the circuit may be performed while consuming less time. However, such estimates may include a significant error to the analysis that fails to provide a clear understanding of the operation of the circuit. Thus, a circuit designer may not adequately rely on the estimated analysis of the circuit design, particularly as microelectronic circuits operate and fast speeds such that there is a small room for error in the circuit analysis. There is a need for fast and automated design analysis methods which improve the productivity and efficiency of circuit design computing systems and/or circuit designers.

In one particular example, a computing system or circuit designer may adjust some dimension of a transistor component of a microelectronic circuit design to fine-tune the performance of the circuit. The adjustment to the transistor component may be done to account for the portion of the circuit footprint area that is consumed by the transistor footprint. In another example, the dimensions of the transistor component may be adjusted by the computing system to adjust the performance parameters of the component. Regardless of the reason behind adjusting one or more dimensions of the transistor component, such adjustments may include a re-layout and re-extraction of the circuit to determine if the adjustment to the component satisfies the performance requirement of the circuit design. As discussed, such re-layout and re-extraction operations are time consuming such that estimations of the effects of the adjustment to the transistor may be used.

One particular performance parameter of the circuit that may be analyzed by the computing system includes the input capacitance to the transistor and the effect of the input capacitance to the transistor has on the overall circuit performance. However, a model of the transistor components utilized by many computing systems to estimate the effect of the transistor on the circuit does not accurately estimate such input capacitance to the altered transistor. Rather, the error of the estimates of the input capacitance due to the transistor in many models of the transistor that is used by computing systems may be as high as 18%, and may be either a pessimistic estimate or an optimistic estimate. More accurate estimates of the input capacitance of the transistor may only be obtained through extraction of the transistor model during simulation of the circuit by the computing system. As such, a more accurate estimate of the input capacitance of the transistor of the circuit design is needed. More particularly, a more accurate estimate of the input capacitance of a transistor whose dimensions have been altered by a circuit designer or the computing system to fine-tune the performance of the circuit is needed. This estimate should be available without performing a re-layout and extraction of the circuit design, thereby saving time and improving the efficiency of the circuit design.

Although discussed below with reference to an input capacitance of a transistor with altered dimensions, it should be appreciated that similar techniques may be applied to the alteration of other components of a microelectronic circuit, such as other transistor-type components. Further, the methods and systems discussed herein may be applicable to real circuit layouts and applies to different types of circuit performance metrics, including delay analysis and power analysis of the circuit. Such techniques may be applied to various circuit design types, including combination circuits, flop circuits, and complex memory designs.

In general, input capacitance to a transistor component of the circuit design may be estimated based on the change in the width of the transistor from the computing system or the circuit designer. Additional terms may also be utilized to fine-tune the estimate based on experimental studies of various circuit designs. In addition, the estimated input capacitance of the transistor may be influenced by several components of the circuit that electrically connect to the altered transistor. For example, a transistor may include a pin connected to a shared virtual net of the circuit design that also includes a connection to a pin of the altered transistor. Because of the connected pin to the shared virtual net, the unaltered transistor may influence the estimated input capacitance of the altered transistor, as discussed in more detail below. In this manner, multiple input capacitance estimates may be calculated by the computing system and applied at one or more virtual nets of the circuit to estimate the capacitance seen by the circuit due to the adjusted width of a transistor of the circuit design.

Figure 2:
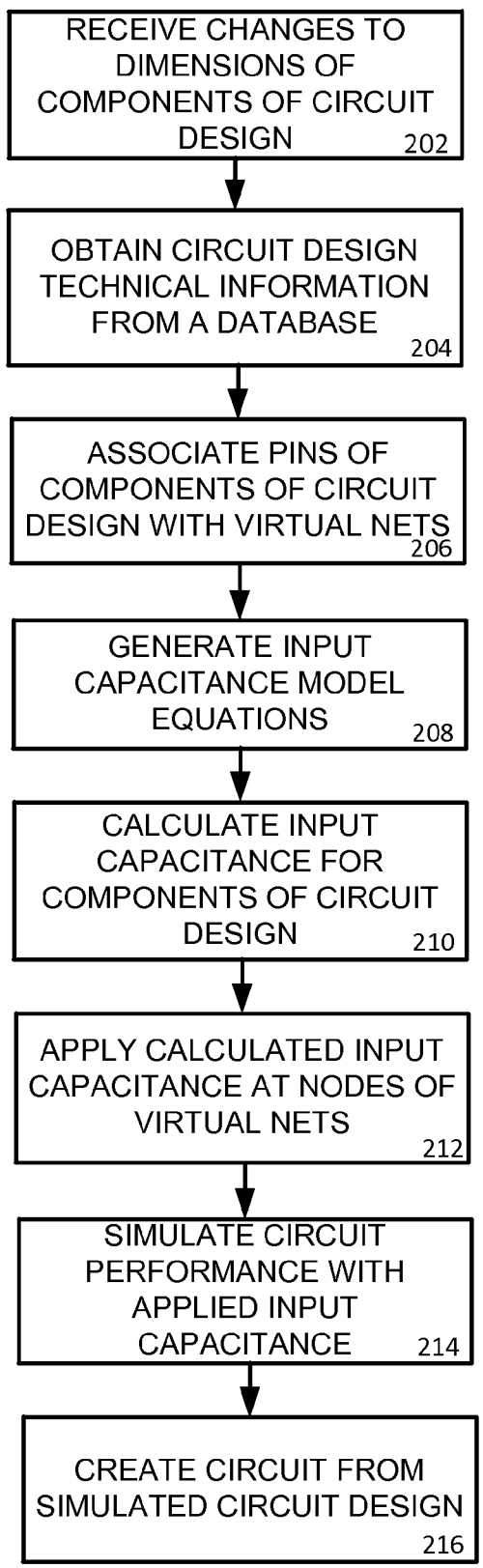
FIG. 2 is a flowchart of a method for modeling an input capacitance for a transistor of an electronic circuit design for use in analyzing the performance of the circuit.

FIG. 2 is a flowchart of a method for modeling an input capacitance for one or more components of an electronic circuit design for use in analyzing the performance of the circuit. In one embodiment, the operations of the method of FIG. 2 may be performed by a computing system, such as a computing device executing circuit design and circuit simulation programs. As such, the operations may be performed utilizing one or more software programs, one or more circuits of hardware components, and/or a combination of software and hardware components. Further, one or more of the operations may be performed automatically or in response to an input from a circuit designer.

Beginning in operation 202, the computing system receives one or more changes to the dimensions of a component of the circuit. In one particular example, a width of a transistor component of the circuit may be altered and such an alteration is received by the computing system. In one embodiment, the alteration to the dimensions of the component is received from a user of the computing system through an input device, perhaps through a circuit design program. The user may utilize the input device to indicate a change in the dimensions of the component manually or through a user interface that illustrates one or more components of the circuit. In another embodiment, the computing system may adjust the width of the transistor of the circuit design in response to a desired circuit performance parameter or an analysis of one or more performance criteria of the circuit after a simulation of the circuit.

With the adjusted width of the component, the computing system obtains technical information of the circuit design from one or more databases storing information of the circuit. As explained in more detail below, such information may include information of the adjusted transistor, such as the transistor name, previous transistor width, location within the circuit (i.e. electrical connections to other components in the circuit), the types and virtual connections of the source, gate, and drain pins of the transistor, the transistor type, and/or the new transistor width. In general, any information concerning the transistor and/or the circuit may be obtained by the computing device. Additional information may be computed by the computing system, such as the aggregate capacitance of each virtual net associated with the transistor. Further still, information pertaining to the circuit layout, including the names, types, and connection information for components connected to the altered transistor may also be obtained. The information obtained by the computing system may be stored in a database associated with the computing system for use by the system in estimating the input capacitance of the altered transistor component of the circuit.

In operation 206, the computing system associates one or more pins of the altered transistor of the circuit with one or more virtual nets of the circuit design. In particular, the computing system may analyze the circuit design and determine the connection of the pins of the altered transistor to pins of other components of the circuit. A connection between the altered transistor and another component of the circuit may be identified with a virtual net of the circuit from the circuit design. As such, virtual nets of the design may include many connections between components (and ground or power, in some instances), referred to as nodes herein. For example, a connection between a circuit component and the altered transistor's drain, gate, or source pins based on the circuit design may be associated with a virtual net of the circuit. The association of one or more pins of the altered transistor of the circuit with one or more virtual nets of the circuit design is discussed in more detail below with reference to the method of FIG. 4.

Figure 3:
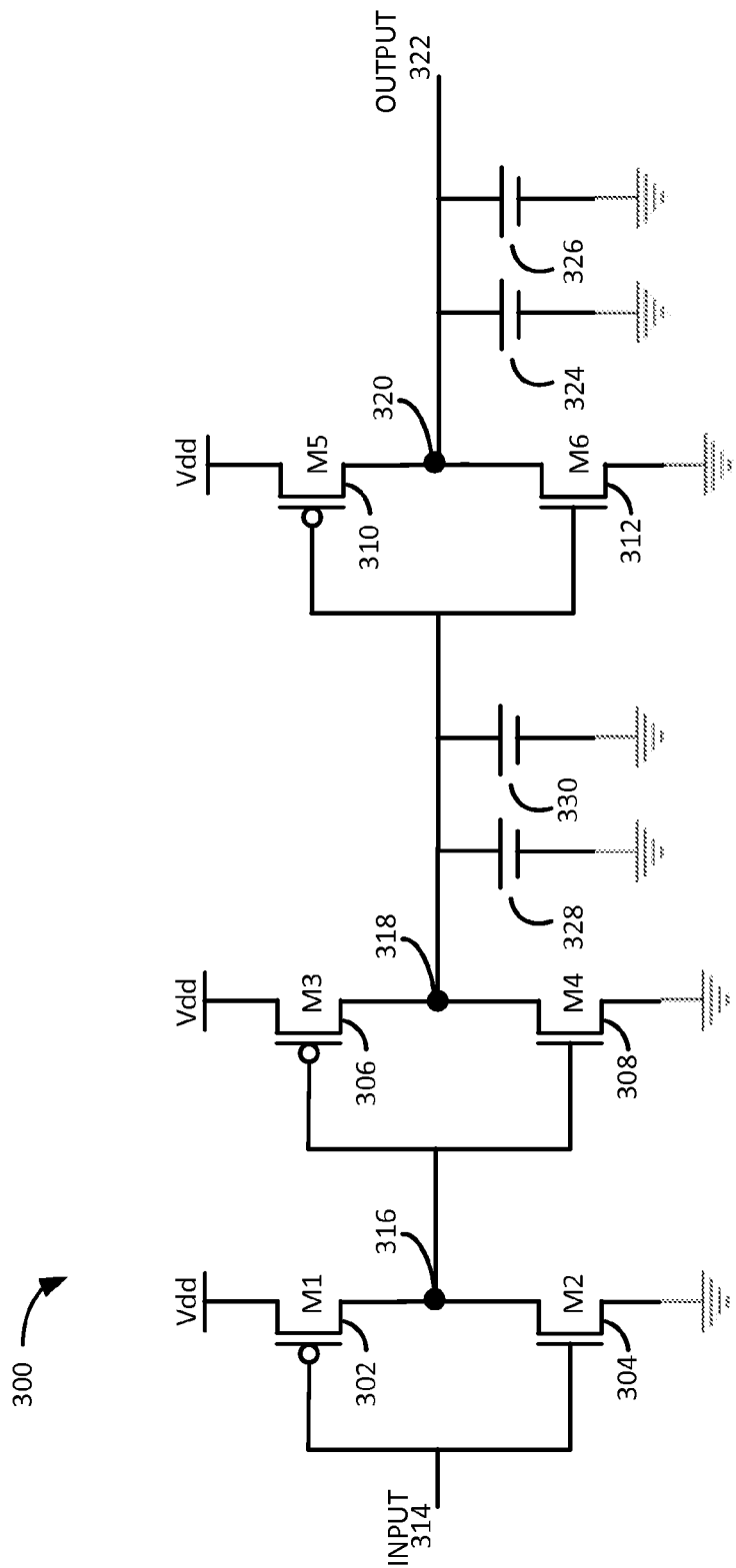
FIG. 3 is a schematic diagram illustrating an estimated input capacitance adjustment to a model of one or more components of an electronic circuit design.

In operation 208, the computing system generates one or more input capacitance model equations for estimating an input capacitance in the circuit due to the altered dimension to the model of the transistor component. The generation of the input capacitance model equations may be described in relation to the circuit illustrated in FIG. 3. In particular, FIG. 3 is a schematic diagram illustrating an estimated input capacitance adjustment to a model of one or more components of an electronic circuit design. The circuit 300 of FIG. 3 is but an example of a portion of a microelectronic circuit that may be designed and simulated by the computing system described herein. In general, more or fewer components may be included in the circuit design such that the circuit 300 of FIG. 3 is but a portion of the larger circuit design. Further, the interconnections of the components of the circuit 300 are utilized for example purposes only to illustrate the generation and application of the input capacitance model equations.

The circuit 300 of FIG. 3 includes several transistors 302-312 interconnected or otherwise in electrical communication. In one example, the circuit may form a portion of a memory circuit of a microprocessor. The transistors 302-312 of the circuit 300 are labeled M1-M6 in the schematic of FIG. 3 and are connected to form a series of transistor pairs. In particular, transistor M1 302 and transistor M2 304 form a first transistor pair, transistor M3 306 and transistor M4 308 form a second transistor pair, and transistor M5 310 and transistor M6 312 form a third transistor pair. The transistor pairs of the circuit 300 are connected in series such that the output for one transistor pair provides the input for the next transistor pair in the series. Further, as explained in more detail below, the dimensions of one or more of the transistors may be adjusted during circuit design and simulation to fine-tune the performance of the circuit 300.

As shown in FIG. 3, an input signal 314 is provided to a gate input for transistor M1 302 and transistor M2 304. The source pin of transistor M1 302 is connected to a power source (Vdd) and the source pin of transistor M2 304 is connected to ground (or Vss, in some embodiments). Further, the drain pin of the transistor M1 302 is in electrical communication with the drain pin of transistor M2 304 at node 316 to form the output of the first transistor pair. The second transistor pair M3 306 and M4 308 utilize node 316 as an input. The second transistor pair and the third transistor pair include the same construction as the first transistor pair for form the series of transistor pairs. In particular, the output of the second transistor pair is labeled as node 318 and the output of the third transistor pair is labeled as node 320. Node 320 also functions as the output 322 of the circuit 300. However, it should be appreciated that any number of transistor pairs may be connected in series in the circuit in a similar fashion as illustrated.

Returning to the method of FIG. 2, one or more of the dimensions of the transistors of the circuit 300 may be adjusted. Although discussed throughout the present disclosure as adjustment of a width of the transistors, it should be appreciated that any aspect of the transistor may be adjusted. For example, the number of fins may be adjusted for FinFET devices. In another example, a length of the transistor may be adjusted. In the example discussed herein, the widths of transistor M5 310 and transistor M6 312 may be increased or decreased by the computing system to fine-tune the performance of the transistors in the circuit. This adjustment may be received by the computing system and technical information concerning those transistors is obtained. Further, one or more virtual nets are present in the design database and associated with the adjusted transistors. In particular, the nodes 316-320 of the circuit 300 are illustrations of portions of virtual nets of the design database of the circuit as the nodes represent the portions of the circuit where one or more components connect to the adjusted transistors. In this example, because transistor M5 310 and transistor M6 312 are adjusted, node 318 and node 320 may be considered as parts of virtual nets by the computing system as other components (namely transistor M3 306 and transistor M4 308 connect to node 318 and the output signal connects to node 320). These virtual nets include the connection of the adjusted transistors to the rest of the microelectronic circuit and generally include all connections between components of the circuit and the adjusted transistors. Thus, although illustrated in FIG. 2 as nodes, it should be appreciated that the virtual nets may include many connections or nodes between a circuit component and one or more pins of adjusted transistor. Thus, the virtual net associated with node 316 includes the connection between the drain pin of the transistor M1 302, the drain pin of transistor M2 304, and the gate input for transistor M3 306 and transistor M2 308.

With the adjustment to the dimension of the transistors received, the computing system may then generate one or more input capacitance model equations to determine an input capacitance adjustment for the adjusted transistors. In one embodiment, the input capacitance model equations take the form of:

$$\Delta C = K_{g/d/s} * C_1 * ((W_2 - W_1)/W_1) \quad (1)$$

where $\Delta C$ is the change to the input capacitance at the virtual net or nets due to the change in width of the transistor width, $K_{g/d/s}$ is a multiplication factor discussed in more detail below, $C_1$ is the original input capacitance at the virtual net before adjustment of the transistor width, $W_1$ is the original width of the transistor, and $W_2$ is the new width of the transistor. The input capacitance model equation is based on the fundamental relationship that the input capacitance of a transistor is directly proportional to the width of the transistor. One or more of these input capacitance model equations may be created by the computing system based on the number of transistors adjusted and/or the number of virtual nets associated with the adjusted transistors. Also, technical information obtained concerning the circuit 300 may be utilized by the computing system to populate the variables of the one or more of the generated input capacitance model equations.

The virtual net for which the input capacitance should be considered may be connected to multiple transistors. In general, the original input capacitance is calculated by approximating the original capacitance as a weighted width ratio times the capacitance on the virtual net as seen in the original design database of the circuit. In particular, the equation (2) may be utilized:

$$C_1 = (W_2/\Sigma W_i) * C_v \qquad (2)$$

where i=2 to k (k equal to the number of transistors connected to the virtual net), $W_2$ is the transistor width to be adjusted, $W_2, \ldots W_k$ are the transistor widths of all of the transistors connected to the virtual net, and $C_v$ is the aggregate capacitance on the virtual net as seen in the original extracted design database for the circuit. Circuit capacitances that may be included into $C_v$ are Miller Capacitances, Intrinsic Transistor Capacitances, Wire Capacitances, and Ground Capacitances, all of which may be provided by the original extracted design database for the circuit at the virtual net.

As mentioned, the input capacitance model equation includes a multiplication factor, shown as $K_{g/d/s}$ in the equation. In one embodiment of the input capacitance model equation, the multiplication factor may be of different values depending on where the input capacitance model is added to the circuit. For example, input capacitance added to the gate terminal of a transistor may have one value ($K_g$) while input capacitance added to the drain or source terminal of a transistor may have a different value ($K_{d/s}$). Also, the multiplication factor of the input capacitance model equation may be configurable. In one example, several iterations of the input capacitance modeling method may be performed to fine-tune the multiplication factor added to the equations to be more and more accurate. In another embodiment, the multiplication factor may be dependent upon the type of transistor used. For example, other multiplication factors may be calculated or otherwise determined for Finfet devices or other transistor-type devices.

Once the input capacitance model equations are generated, the computing system may, in operation 210 of the method of FIG. 2, calculate the input capacitance adjustment for each virtual net identified by the computing system and, in operation 212, apply the calculated input capacitances to the pins of the adjusted transistors. In general, the calculated input capacitance is added to the circuit through one or more capacitor elements connected between ground and the pins of the transistor connected to the identified virtual nets. Utilizing the circuit 300 of FIG. 3 as an example, assume that the dimensions (such as the width) of transistor M5 310 and transistor M6 312 are adjusted by the computing system. In this case, a first input capacitance element 324 is added between the drain pin of transistor M5 310 (represented by node 320) and ground for the change in width of transistor M5 310. Another input capacitance element 328 is added between the gate pin of transistor M5 310 and ground for the change in width of transistor M5. Similar input capacitance elements may be added for the change in width to transistor M6 312. Namely, an input capacitance element 326 is added between the drain pin of transistor M6 312 (represented by node 320) and ground for the change in width of transistor M6 and another input capacitance element 330 is added between the gate pin of transistor M6 312 and ground for the change in width of transistor M6. The values of these input capacitance elements 324-330 are obtained through the input capacitance model equations generated above.

Although shown in the circuit 300 as being connected to the transistors of the circuit, it should be appreciated that the circuit as designed only includes the transistors shown. Thus, the input capacitance elements 324-330 are added to the circuit to estimate the input capacitance of the circuit due to changing the dimension of one or more of the transistors.

As such, the input capacitance elements 324-330 may not be included in the circuit design, but are only added as input files to a simulation program as estimated input capacitance of the transistors, as described in more detail below. Such capacitors are includes in the schematic 300 of FIG. 3 to illustrate the location of the estimates in the circuit design and should not be considered as individual components of the circuit design.

Continuing the above example, although the widths of transistor M5 310 and transistor M6 312 are altered, the widths of transistors M1-M4 302-308 remain the same. Further, because transistor pair M1-M2 are not connected to the transistors that are altered, the widths of those transistors may be ignored by the computing system in relation to calculating the one or more input capacitance model equations. In contrast, the drain pins of transistor pair M3-M4 do share a virtual net (node 318) with the altered transistors, so the widths of those transistors may be obtained by the computing system from a database. In one particular example, the width of transistor M3 306 is $300e^{-9}$ meters (300 nanometers) and the width of transistor M4 308 is $200e^{-9}$ meters. Other information concerning the circuit 300 may also be obtained by the computing system. For example, the aggregate capacitance for virtual net 318 and virtual net 320 may be obtained from the database. In one example, the $C_v$ for virtual net 318 is $0.02e^{-12}$ farads and the $C_v$ for virtual net 320 is $0.01e^{-12}$ farads. This information, along with other circuit information, may be utilized by the computing system to calculate the values of the input capacitance elements of the circuit to estimate the input capacitance and performance of the circuit.

The computing system may begin by calculating the original capacitance at the virtual nets, $C_1$. For input capacitance element 324 ($C_{DM5}$), the original capacitance equals:

$$W_{M5}/(W_{M5}+W_{M6})*C_v \qquad (3)$$

where $W_{M5}$ is the parameterized width of transistor M5 310, $W_{M6}$ is the parameterized width of transistor M6 312 (since transistor M6 is also connected to the virtual net 320), and $C_v$ is $0.01e^{-12}$ farads. Similarly, for input capacitance element 326 ($C_{DM6}$), the original capacitance equals:

$$W_{M6}/(W_{M5}+W_{M6})*C_v \qquad (4)$$

utilizing the same values for the variables as in equation (3).

For input capacitance element 328 ($C_{GM5}$), the original capacitance equals:

$$(W_{M5}/(W_{M5}+W_{M6}+W_{M3}+W_{M4}))*C_v \qquad (5)$$

where $W_{M5}$ is the parameterized width of transistor M5 310, $W_{M6}$ is the parameterized width of transistor M6 312, $W_{M3}$ is the parameterized width of transistor M3 306 (in this case $300e^{-9}$), $W_{M4}$ is the parameterized width of transistor M4 308 (in this case $200e^{-9}$) and $C_v$ is $0.02e^{-12}$ farads. Similarly, for input capacitance element 330 ($C_{GM6}$), the original capacitance equals:

$$(W_{M6}/(W_{M5}+W_{M6}+W_{M3}+W_{M4}))*C_v \qquad (6)$$

utilizing the same values for the variables as in equation (5).

With the original capacitance $C_1$ calculated for each input capacitance model equation associated with the input capacitance elements 324-330, the computing system may then calculate the input capacitance value for each element. In particular, the input capacitance value for capacitance element $C_{DM5}$ 324 equals:

$$K_{d/s}*C_1*((W_{M5}-W_{M5O})/W_{M5O} \qquad (7)$$

where $K_{d/s}$ is 0.44, $C_1$ is calculated above, $W_{M5}$ is the parameterized width of transistor M5 310, and $W_{M5O}$ is the original width of transistor M5 before adjusted, in this case $600e^{-9}$. Thus, in this particular example:

$$C_{DM5}=0.44*(W_{M5}/(W_{M5}+W_{M6}))*0.01e^{-12}*((W_{M5}-600e^{-9})/600e^{-9}). \quad (8)$$

It should be appreciated that the value for $K_{d/s}$ is configurable and is based on the transistor pin connected to the virtual net 320. Through this equation, the computing system determines an input capacitance value to give to capacitance element $C_{DM5}$ 324 to estimate the input capacitance of the adjusted transistor M5 310. Similarly, the input capacitance value for capacitance element $C_{DM6}$ 326 equals:

$$K_{d/s}*C_1*((W_{M6}-W_{M6O})/W_{M6O}) \quad (9)$$

where $K_{d/s}$ is 0.44, $C_1$ is calculated above, $W_{M6}$ is the parameterized width of transistor M6 312, and $W_{M6O}$ is the original width of transistor M6 before adjusted, in this case $400e^{-9}$. Thus, in this particular example:

$$C_{DM6}=0.44*(W_{M6}/(W_{M5}+W_{M6}))*0.01e^{-12}*((W_{M6}-400e^{-9})/400e^{-9}). \quad (10)$$

Through this equation, the computing system determines an input capacitance value to give to capacitance element $C_{DM6}$ 326 to estimate the input capacitance of the adjusted transistor M6 312.

Because the widths of transistor M5 310 and transistor M6 312 are adjusted, input capacitance values are also calculated for virtual net 318. Note that input capacitance values are not calculated for virtual net 316 as the transistor components connected to that node are not adjusted. In particular, the input capacitance value for capacitance element $C_{GM5}$ 328 due to the width adjustment of transistor M5 310 equals:

$$K_g*C_1*((W_{M5}-W_{M5O})/W_{M5O}). \quad (11)$$

In this case, $K_g$ is 0.77 due to this input capacitance being connected to the gate of the adjusted transistor. $C_1$ is calculated above, $W_{M5}$ is the parameterized width of transistor M5 310, and $W_{M5O}$ is the original width of transistor M5 before adjusted, in this case $600e^{-9}$. Thus, in this particular example:

$$C_{GM5}=0.77*(W_{M5}/(W_{M5}+W_{M6}+200e^{-9}+300e^{-9})) *0.02e^{-12}*((W_{M5}-600e^{-9})/600e^{-9}). \quad (12)$$

As shown, this equation includes the widths of transistor M3 306 and transistor M4 308 in calculating $C_1$ and the $C_v$ for virtual net 318. Through this equation, the computing system determines an input capacitance value to give to capacitance element $C_{GM5}$ 328 to estimate the input capacitance of the adjusted transistor M5 310. Similarly, the input capacitance value for capacitance element $C_{GM6}$ 330 equals:

$$K_g*C_1*((W_{M6}-W_{M6O})/W_{M6O}) \quad (13)$$

where $K_g$ is 0.77, $C_1$ is calculated above, $W_{M6}$ is the parameterized width of transistor M6 312, and $W_{M6O}$ is the original width of transistor M6 before adjusted. Thus, in this particular example:

$$C_{GM6}=0.77*(W_{M6}/(W_{M6}+W_{M5}+200e^{-9}+300e^{-9})) *0.02e^{-12}((W_{M6}-400e^{-9})/400e^{-9}). \quad (14)$$

Through this equation, the computing system determines an input capacitance value to give to capacitance element $C_{GM6}$ 330 to estimate the input capacitance of the adjusted transistor M6 312.

With the input capacitance for each input capacitance element 324-330 calculated, the computing system may apply the calculated input capacitance at the virtual nets and simulate the performance of the circuit in operation 214. In particular, the computing system may generate in input file in an electronic circuit simulation language as capacitor elements 324-330. This input file may be provided to a simulation program of the computing system and applied to the circuit 300 at the identified virtual nets. This input file to the simulation program provides an estimation of the input capacitance of the adjusted transistors on the circuit 300 without the need to perform an extraction of the circuit design. Further, the estimated input capacitance is relatively accurate in comparison to other estimations of the input capacitance. As such, through the methods and systems described herein, a circuit designer may quickly adjust one or more criteria of components of the circuit (such as a width of a transistor component) and obtain a relatively accurate estimation on the effect the adjustment to the component has on the circuit performance.

Once the simulated circuit performance with the applied input capacitance is within a particular circuit performance parameter, a circuit including the simulated components may be generated in operation 216. In one implementation, the circuit is a portion of a larger circuit, such as a memory component of a microprocessor circuit. For example, the transistor components simulated above may be utilized to create the circuit of FIG. 3 alone or as part of a larger circuit design. In other words, the simulated transistors correspond to one or more transistor components of a circuit that are then connected in accordance with the circuit design to achieve the aim of the circuit design.

Although discussed above with relation to widths of a transistor component of a circuit design, it should be appreciated that similar techniques may be applied to the alteration of other components and/or other aspects of the components of a microelectronic circuit. However, in the embodiments where other components or aspects of the component are altered, different input capacitance model equations may be generated to account for the other aspects of the component that is altered.

Figure 4:
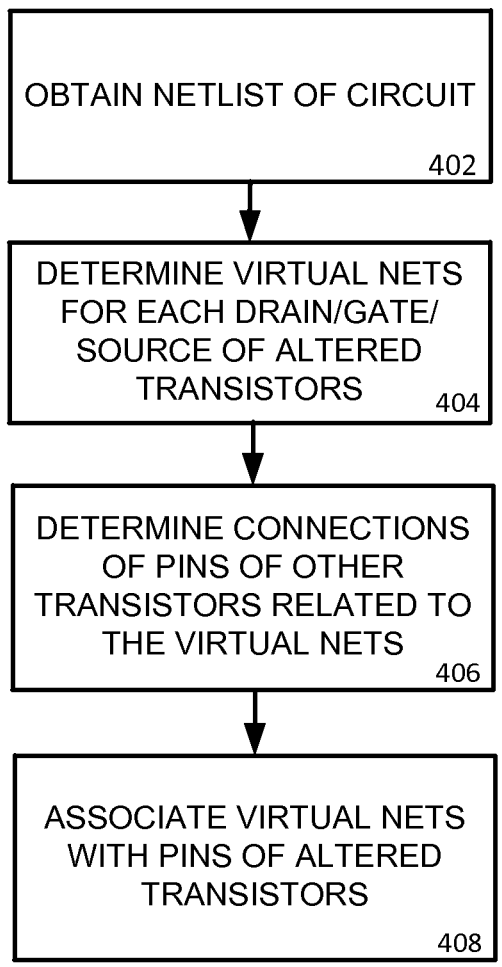
FIG. 4 is a flowchart of a method for associating virtual nets within an electronic circuit design for use in modeling an input capacitance for one or more components of the circuit.

FIG. 4 is a flowchart of a method for associating virtual nets within an electronic circuit design for use in modeling an input capacitance for one or more components and pins of the circuit. Similar to the method of FIG. 2, the operations of the method of FIG. 4 may be performed by a computing system, such as a computing device executing circuit design and circuit simulation programs. As such, the operations may be performed utilizing one or more software programs, one or more circuits of hardware components, and/or a combination of software and hardware components. Further, one or more of the operations may be performed automatically or in response to an input from a circuit designer. In one specific example, the operations of the flowchart of FIG. 4 are performed by the computing system during operation 206 described above with relation to FIG. 2.

Beginning in operation 402, the computing system obtains a design database that describes the design of the circuit under simulation. In one embodiment, the design database of the circuit is obtained from a database associated with the computing system. From the design database, the computing system determines a virtual net or node for each pin of the altered component in operation 404. In one particular example, the computing system determines a virtual net for each of the drain, gate, and source pins of the transistor that is altered. In operation 406, the computing system analyzes the design database that describes the circuit design to determine the interconnection between the pins of the transistor and other components of the circuit. In general, the design database may describe which pins of which components are electrically connected such that the computing system may then determine which component is connected to the altered component of the circuit and how those components are interconnected. Thus, through analysis of the design database, the computing system may not only determine the component interconnected with the altered component, but which pins of those components connect to the particular pins of the altered transistor or other component.

Once the interconnection of the altered transistor and the other components of the circuit are determined, the computing system may then associate one or more pins of components of the circuit with the virtual nets in operation 408. In particular, a virtual net may be associated with the gate, drain, and source pins of the altered transistor, if those pins electrically connect to another component of the circuit. The associated virtual nets may then be utilized by the computing system to estimate the input capacitance for one or more altered component of the circuit under simulation as described above.

Figure 5:
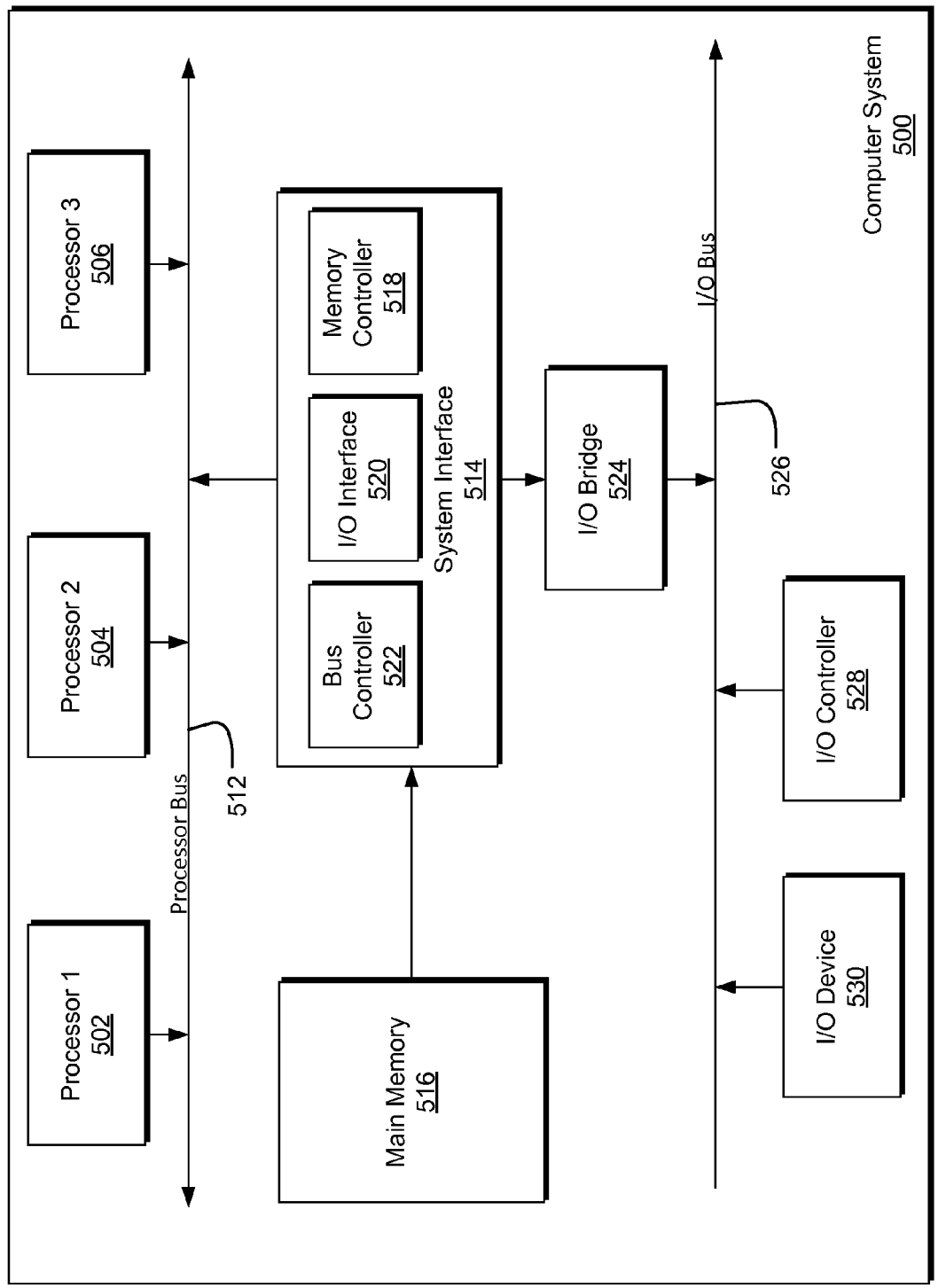
FIG. 5 is an example computing system that may implement various systems and methods discussed herein.

FIG. 5 is a block diagram illustrating an example of a computing device or computer system 500 which may be used in implementing the embodiments of the present disclosure. The computer system (system) includes one or more processors 502-506. Processors 502-506 may include one or more internal levels of cache (not shown) and a bus controller or bus interface unit to direct interaction with the processor bus 512. Processor bus 512, also known as the host bus or the front side bus, may be used to couple the processors 502-506 with the system interface 514. System interface 514 may be connected to the processor bus 512 to interface other components of the system 500 with the processor bus 512. For example, system interface 514 may include a memory controller 513 for interfacing a main memory 516 with the processor bus 512. The main memory 516 typically includes one or more memory cards and a control circuit (not shown). System interface 514 may also include an input/output (I/O) interface 520 to interface one or more I/O bridges or I/O devices with the processor bus 512. One or more I/O controllers and/or I/O devices may be connected with the I/O bus 526, such as I/O controller 528 and I/O device 530, as illustrated.

I/O device 530 may also include an input device (not shown), such as an alphanumeric input device, including alphanumeric and other keys for communicating information and/or command selections to the processors 502-506. Another type of user input device includes cursor control, such as a mouse, a trackball, or cursor direction keys for communicating direction information and command selections to the processors 502-506 and for controlling cursor movement on the display device.

System 500 may include a dynamic storage device, referred to as main memory 516, or a random access memory (RAM) or other computer-readable devices coupled to the processor bus 512 for storing information and instructions to be executed by the processors 502-506. Main memory 516 also may be used for storing temporary variables or other intermediate information during execution of instructions by the processors 502-506. System 500 may include a read only memory (ROM) and/or other static storage device coupled to the processor bus 512 for storing static information and instructions for the processors 502-506. The system set forth in FIG. 5 is but one possible example of a computer system that may employ or be configured in accordance with aspects of the present disclosure.

According to one embodiment, the above techniques may be performed by computer system 500 in response to processor 504 executing one or more sequences of one or more instructions contained in main memory 516. These instructions may be read into main memory 516 from another machine-readable medium, such as a storage device. Execution of the sequences of instructions contained in main memory 516 may cause processors 502-506 to perform the process steps described herein. In alternative embodiments, circuitry may be used in place of or in combination with the software instructions. Thus, embodiments of the present disclosure may include both hardware and software components.

A machine readable medium includes any mechanism for storing or transmitting information in a form (e.g., software, processing application) readable by a machine (e.g., a computer). Such media may take the form of, but is not limited to, non-volatile media and volatile media. Non-volatile media includes optical or magnetic disks. Volatile media includes dynamic memory, such as main memory 516. Common forms of machine-readable medium may include, but is not limited to, magnetic storage medium; optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions.

Embodiments of the present disclosure include various operations or steps, which are described in this specification. The steps may be performed by hardware components or may be embodied in machine-executable instructions, which may be used to cause a general-purpose or special-purpose processor programmed with the instructions to perform the steps. Alternatively, the steps may be performed by a combination of hardware, software and/or firmware.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the described features. Accordingly, the scope of the present invention is intended to embrace all such alternatives, modifications, and variations together with all equivalents thereof.

What is claimed is:

1. A method for analyzing performance of a microelectronic circuit design comprising:
receiving an alteration of an original width to a received width of an expected footprint of a first component of the microelectronic circuit design;
obtaining technical information of the first component of the microelectronic circuit design from a database storing at least one design file of the microelectronic circuit design;
associating at least one first pin of the first component of the microelectronic circuit design and a first pin of a second component of the microelectronic circuit design with a first virtual net of the microelectronic circuit design;
calculating a first input capacitance from at least one input capacitance model estimate, the first input capacitance associated with the alteration of the original width to the received width of the expected footprint of the first component of the microelectronic circuit design, wherein the at least one input capacitance model estimate comprises the received width of the footprint of the first component minus the original width of the footprint of the first component, divided by the original width of the footprint of the first component;

simulating the microelectronic circuit design while applying the calculated first input capacitance at the first virtual net, the simulation providing at least one circuit performance parameter based at least on the calculated first input capacitance of the first virtual net; and creating a microelectronic circuit comprising at least the first component from the microelectronic circuit design.

2. The method of claim 1 wherein the first component is a transistor comprising a source pin, a drain pin, and a gate pin.

3. The method of claim 2 wherein the alteration of the original width to the received width of the expected footprint of the first component of the microelectronic circuit design comprises a change in a width of a footprint of the transistor.

4. The method of claim 3 wherein the at least one input capacitance model estimate indicates an estimated difference in an input capacitance for the transistor based on the change in the width of the expected footprint of the transistor.

5. The method of claim 3 wherein the first virtual net comprises at least one of the source pin, the drain pin, and the gate pin of the transistor.

6. The method of claim 5 wherein the at least one input capacitance model estimate comprises a multiplication factor based on at least the source pin, the drain pin, and the gate pin of the first virtual net.

7. The method of claim 5 wherein the at least one input capacitance model estimate comprises an original capacitance of the first virtual net, the original capacitance of the first virtual net obtained from the database storing the at least one design file of the microelectronic circuit design.

8. The method of claim 7 wherein the original capacitance of the first virtual net obtained from the database comprises an aggregate capacitance of the first virtual net obtained from an extraction of the microelectronic circuit design stored in the database.

9. The method of claim 5 wherein a second virtual net comprises an electrical connection point between a third component of the microelectronic circuit design and at least one of the source pin, the drain pin, and the gate pin of the transistor of the microelectronic circuit design.

10. The method of claim 9 further comprising:

calculating a second input capacitance from at least another input capacitance model estimate, the second input capacitance associated with the change to the width of the footprint of the transistor of the microelectronic circuit design; and simulating the microelectronic circuit design while applying the calculated second input capacitance at the second virtual net.

11. A microelectronic circuit comprising:

a transistor comprising at least one pin; and a second component comprising a first pin; wherein at least one circuit performance parameter of the transistor in the microelectronic circuit is determined through the operations of:

receiving an alteration of an original width to a received width of an expected footprint of the transistor of the microelectronic circuit;

obtaining technical information of the transistor of the microelectronic circuit from a database storing at least one design file of the microelectronic circuit;

associating at least one pin of the transistor of the microelectronic circuit and a first pin of the second component with a first virtual net;

calculating a first input capacitance from at least one input capacitance model estimate, the first input capacitance associated with the alteration of the original width to the received width of the expected footprint of the transistor of the microelectronic circuit, wherein the at least one input capacitance model estimate comprises the received width of the footprint of the transistor minus the original width of the footprint of the transistor, divided by the original width of the footprint of the transistor;

generating an input file to a computing system, the input file instructing the computing system to apply the calculated first input capacitance at the first virtual net during a simulation of the microelectronic circuit; and simulating the microelectronic circuit while utilizing the input file, the simulation providing the at least one circuit performance parameter based at least on the calculated first input capacitance of the first virtual net.

12. The microelectronic circuit of claim 11 wherein the at least one input capacitance model estimate indicates an estimated difference in an input capacitance for the transistor based on the alteration to the width of the expected footprint of the transistor.

13. The microelectronic circuit of claim 11 wherein the first virtual net comprises at least one of a source pin, a drain pin, and a gate pin of the transistor and the pin of the second component.

14. The microelectronic circuit of claim 13 wherein the at least one input capacitance model estimate comprises a multiplication factor based on at least the source pin, the drain pin, and the gate pin of the first virtual net.

15. A system for simulating a microelectronic circuit design, the system comprising:

a database storing at least one design file for the microelectronic circuit design;

a computing device in communication with the database; and a computer-readable medium with one or more executable instructions stored thereon, wherein the computing device executes the one or more executable instructions to perform the operations of:

receiving an alteration of an original width to a received width of an expected footprint of a transistor of the microelectronic circuit design;

obtaining technical information of the transistor of the microelectronic circuit design from the database;

associating the at least one pin of the transistor of the microelectronic circuit design and a first pin of a second component of the microelectronic circuit design with a first virtual net of the microelectronic circuit design;

calculating a first input capacitance from at least one input capacitance model estimate, the first input capacitance associated with the alteration of the original width to the received width of the expected footprint of the transistor of the microelectronic circuit design, wherein the at least one input capacitance model estimate comprises the received width of the footprint of the transistor minus the original width of the footprint of the transistor, divided by the original width of the footprint of the transistor;

generating an input file to the computing device, the input file instructing the computing device to apply the calculated first input capacitance at the first virtual net during a simulation of the microelectronic circuit design; and simulating the microelectronic circuit design while utilizing the input file, the simulation providing at least one circuit performance parameter based at least on the calculated first input capacitance of the first virtual net, wherein the microelectronic circuit design is utilized to create a microelectronic circuit from the microelectronic circuit design.

16. The system of claim 15 wherein the at least one input capacitance model estimate indicates an estimated difference in an input capacitance for the transistor based on the alteration to the width of the expected footprint of the transistor.

17. The system of claim 15 wherein the at least one input capacitance model estimate comprises an original capacitance of the first virtual net, the original capacitance of the first virtual net obtained from the database storing the at least one design file of the microelectronic circuit design.

18. The system of claim 17 wherein the original capacitance of the first virtual net obtained from the database comprises an aggregate capacitance of the first virtual net obtained from an extraction of the microelectronic circuit design stored in the database.

* * * * *

UNITED STATES PATENT AND TRADEMARK OFFICE
CERTIFICATE OF CORRECTION

| | |
|---|---|
| PATENT NO. | : 9,665,673 B2 |
| APPLICATION NO. | : 14/790790 |
| DATED | : May 30, 2017 |
| INVENTOR(S) | : Sattiraju et al. |

It is certified that error appears in the above-identified patent and that said Letters Patent is hereby corrected as shown below:

In Column 11, Line 13, delete "-WMO)" and insert -- -WM6O) --, therefor.

In Column 11, Line 58, delete "*0.02e$^{-12}$((" and insert -- *0.02$^{e-12}$*(( --, therefor.

Signed and Sealed this
Thirtieth Day of January, 2018

Joseph Matal
*Performing the Functions and Duties of the*
*Under Secretary of Commerce for Intellectual Property and*
*Director of the United States Patent and Trademark Office*